(12) United States Patent
Gao et al.

(10) Patent No.: US 12,178,012 B2
(45) Date of Patent: Dec. 24, 2024

(54) DATA PROCESSING DEVICE AND DATA PROCESSING SYSTEM

(71) Applicant: SHENZHEN MICROBT ELECTRONICS TECHNOLOGY CO., LTD., Guangdong (CN)

(72) Inventors: Yang Gao, Guangdong (CN); Fangyu Liu, Guangdong (CN); Qian Chen, Guangdong (CN); Yuefeng Wu, Guangdong (CN); Haifeng Guo, Guangdong (CN); Zuoxing Yang, Guangdong (CN)

(73) Assignee: SHENZHEN MICROBT ELECTRONICS TECHNOLOGY CO., LTD., Shenzhen (CN)

( * ) Notice: Subject to any disclaimer, the term of this patent is extended or adjusted under 35 U.S.C. 154(b) by 205 days.

(21) Appl. No.: 17/928,441

(22) PCT Filed: Jun. 11, 2021

(86) PCT No.: PCT/CN2021/099701
§ 371 (c)(1),
(2) Date: Nov. 29, 2022

(87) PCT Pub. No.: WO2022/068261
PCT Pub. Date: Apr. 7, 2022

(65) Prior Publication Data
US 2023/0217628 A1      Jul. 6, 2023

(30) Foreign Application Priority Data

Sep. 30, 2020  (CN) .......................... 202011069387.8

(51) Int. Cl.
*H05K 7/20*          (2006.01)

(52) U.S. Cl.
CPC ................................ *H05K 7/20263* (2013.01)

(58) Field of Classification Search
CPC .... H05K 7/20; H05K 7/20263; H05K 7/2039; H05K 7/20454; H05K 7/20463;
(Continued)

(56) References Cited

U.S. PATENT DOCUMENTS

| 2020/0196489 | A1  | 6/2020 | Chang et al. | |
|---|---|---|---|---|
| 2021/0296963 | A1* | 9/2021 | Barbour | ................ H04L 9/3239 |
| 2022/0043494 | A1* | 2/2022 | Yang | ................ H05K 7/20818 |

FOREIGN PATENT DOCUMENTS

| CN | 201821591 U | * | 5/2011 |
|---|---|---|---|
| CN | 205721569 U |   | 11/2016 |

(Continued)

OTHER PUBLICATIONS

WO-2023169116-A1 English Translation (Year: 2023).*
(Continued)

*Primary Examiner* — Amir A Jalali
(74) *Attorney, Agent, or Firm* — Venable LLP

(57) ABSTRACT

A data processing device and a data processing system are provided. The data processing device includes a housing, which is thermally conductive and defines a sealed accommodating cavity; a hashboard, which is arranged in the accommodating cavity and is in fixed connection to the housing; a control board, which is in communicative connection to the hashboard; and a power supply module, which is in electrical connection to the hashboard.

9 Claims, 4 Drawing Sheets

(58) Field of Classification Search
CPC .............. H05K 7/20472; H05K 7/205; H05K 7/2089–209; H05K 1/0201–0212; H05K 1/021; H05K 1/029; H05K 1/032; H05K 1/185; H05K 2201/06–068; H05K 2201/10416; H01L 23/00; H01L 23/373; H01L 23/367; H01L 23/3733; H01L 23/3735; H01L 23/3736; H01L 23/42; G06F 1/20; G06F 1/183
See application file for complete search history.

(56) References Cited

FOREIGN PATENT DOCUMENTS

| | | | |
|---|---|---|---|
| CN | 206353835 U | 7/2017 | |
| CN | 108681520 A | 10/2018 | |
| CN | 111538382 A | 8/2020 | |
| CN | 213280476 U | 5/2021 | |
| EP | 3575919 A1 * | 12/2019 | |
| WO | WO-2023169116 A1 * | 9/2023 | ........... H05K 5/0217 |

OTHER PUBLICATIONS

WO-2023169116-A1 English Translation (Year: 2019).*
CN-201821591-U English Translation (Year: 2011).*
International Search Report and Written Opinion mailed Aug. 26, 2021 in International Patent Application No. PCT/CN2021/099701.

* cited by examiner

DATA PROCESSING DEVICE AND DATA PROCESSING SYSTEM

CROSS REFERENCE TO RELATED APPLICATIONS

The present application is a U.S. national stage entry of International Application No. PCT/CN2021/099701, filed Jun. 11, 2021, entitled "DATA PROCESSING DEVICE AND DATA PROCESSING SYSTEM", which claims priority to Chinese Patent Application No. 202011069387.8, filed Sep. 30, 2020, entitled "VIRTUAL CURRENCY MINING MACHINE AND MINING MACHINE SYSTEM", both of which are hereby incorporated by reference in their entireties.

TECHNICAL FIELD

The present invention relates to the field of data processing technologies, and in particular, to a data processing device and a data processing system.

BACKGROUND

In the related art, virtual currency mining machines mainly adopt air cooling heat dissipation, and some virtual currency mining machines adopt a water cooled board for heat dissipation. Adopting a water cooled board for heat dissipation generally needs to attach the hashboard to the water cooled board, and the water cooled board is connected to the external water-cycling system through a pipeline. After the heat generated by the hashboard in the working process is absorbed by the water inside the water cooled board, the water-cycling system takes away the heated water inside the water cooled board to achieve the heat dissipation of the hashboard. Since the water-cycling system needs to be deployed through pipelines, this manner of heat dissipation by a water cooled board often makes the heat dissipation system complicated.

SUMMARY

Based on this, it is necessary to provide a data processing device and a data processing system to simplify configuration of a heat dissipation system.

A data processing device is provided, including:
a housing, which is thermally conductive and defines a sealed accommodating cavity; a hashboard, which is arranged in the accommodating cavity and is in fixed connection to the housing; a control board, which is in communicative connection to the hashboard; and a power supply module, which is in electrical connection to the hashboard.

In an embodiment, at least one of the hashboard, the control board, and the power supply module attaches to an inner surface of the housing.

In an embodiment, the housing includes a first inner side wall and a second inner side wall arranged opposite to each other, and a circumferential inner side wall connected between the first inner side wall and the second inner side wall, the first inner side wall, the second inner side wall, and the circumferential inner side wall defining the accommodating cavity; and the control board and the power supply module are both arranged on the first inner side wall and the hashboard is arranged on the second inner side wall.

In an embodiment, the housing includes a first inner side wall and a second inner side wall arranged opposite to each other, and a circumferential inner side wall connected between the first inner side wall and the second inner side wall, the first inner side wall, the second inner side wall, and the circumferential inner side wall defining the accommodating cavity; and the first inner side wall and the second inner side wall are each provided with the hashboard, and the control board and the power supply module are arranged on the circumferential inner side wall.

In an embodiment, the housing is provided with a through hole used for threading a cable, wherein the cable is in electrical connection to the power supply module, and the cable is in sealed connection to the housing.

In an embodiment, a side of the housing facing away from the accommodating cavity is provided with a plurality of heat dissipation fins arranged at intervals; or, a side of the housing facing away from the accommodating cavity is covered with a heat dissipation ceramic coating.

In an embodiment, at least one of the hashboard, the control board, and the power supply module attaches to an inner surface of the housing through a heat dissipation layer, where the heat dissipation layer includes at least one of a graphite layer, a thermally conductive silicone grease layer, and a thermally conductive silicone pad.

In an embodiment, the hashboard is provided with a plurality of hash chipsets, and each of the hash chipsets includes a plurality of hash chips.

A data processing system is provided, including a console and the virtual currency data processing device according to any of the above embodiments, wherein a plurality of data processing devices are configured, the plurality of data processing devices are in electrical connection to the console respectively, and the console is configured to control working states of the data processing devices.

For the data processing device and the data processing system, since the housing is thermally conductive and is provided with an accommodating cavity, and the hashboard is arranged in the accommodating cavity and is in fixed connection to the housing, the heat generated by the hashboard in the working process can be conducted to the housing. The housing can be partially or completely immersed in cooling liquid, such as water, for liquid cooling heat dissipation, and the housing can isolate the cooling liquid from the accommodating cavity to ensure working reliability of the hashboard. The data processing device can reduce the requirements for the cooling liquid, simplifying the configuration of the heat dissipation system and reducing the cost of the heat dissipation system of the data processing device.

BRIEF DESCRIPTION OF THE DRAWINGS

To describe the technical solutions in the embodiments or in the prior art more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

Figure 1:
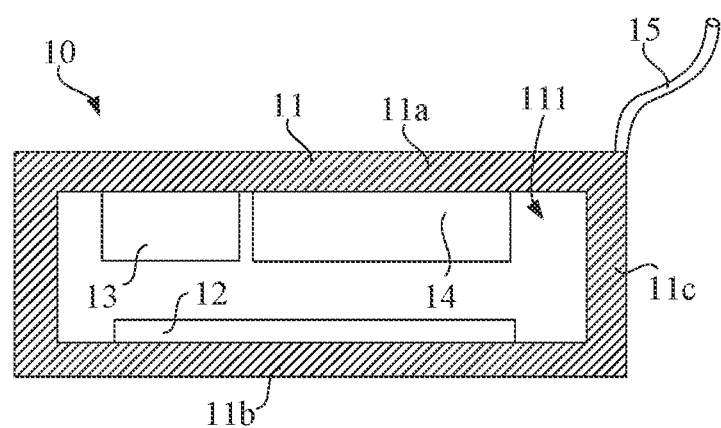
FIG. 1 is a cross-sectional view of a data processing device according to an embodiment.

REFERENCE NUMERALS 10. data processing device
11. housing
11a. first inner side wall
11b. second inner side wall
11c. circumferential inner side wall
11d. heat dissipation fin
111. accommodating cavity
113. heat dissipation layer
12. hashboard
13. control board
14. power supply module
15. cable
16. heat dissipation ceramic coating
20. data processing system
21. console

DETAILED DESCRIPTION

For ease of understanding the present invention, the present invention is described more comprehensively below with reference to the accompanying drawings. Preferred embodiments of the present invention are provided in the accompanying drawings. However, the present invention may be implemented in many different forms, and is not limited to the embodiments described in this specification. On the contrary, the embodiments are provided to make understanding of the disclosed content of the present invention more comprehensive.

It is to be understood that, when a component is referred to as "being fixed to" another component, the component may be directly on the other component, or an intervening component may be present. When a component is considered to be "connected to" another component, the component may be directly connected to the another component, or an intervening component may also be present. The terms "vertical", "horizontal", "left", and "right" and similar expressions used in this specification are merely used for the purpose of description.

Unless otherwise defined, meanings of all technical and scientific terms used in this specification are the same as those usually understood by a person skilled in the art to which the present invention belongs. In this specification, terms used in the specification of the present invention are merely intended to describe objectives of the specific embodiments, but are not intended to limit the present invention. The term "and/or" used in this specification includes any and all combinations of one or more related listed items.

Referring to FIG. 1, in some implementations, a data processing device 10 includes a housing 11 and a hashboard 12 arranged in the housing 11, where the housing 11 is thermally conductive and defines a sealed accommodating cavity 111, and the hashboard 12 is arranged in the accommodating cavity 111 and is in fixed connection to the housing 11. The hashboard 12 can be in fixed connection to the housing 11 in various ways. For example, the hashboard 12 can be in fixed connection to housing 11 by using threaded fasteners, or can be in fixed connection to the housing 11 by bonding or welding. Heat generated by the hashboard 12 in a working process can be conducted to the housing 11 and dissipated to the external environment through the housing 11. In some implementations, the housing 11 is made of aluminum alloy, and the aluminum alloy housing 11 has advantages of light weight, convenient processing, relatively low price, and high cost performance. In other implementations, the housing 11 can also be made of copper alloy and other materials. In some implementations, the data processing device 10 can be partially immersed in cooling liquid such as cooling water for liquid cooling heat dissipation, and the housing 11 can isolate the cooling liquid from the accommodating cavity 111. In some other implementations, the entire housing 11 can be immersed in the cooling liquid to improve heat dissipation efficiency. In this implementation, the housing 11 can also isolate the cooling liquid from the accommodating cavity 111.

In some implementations, the data processing device 10 is an Application-Specific Integrated Circuit (ASIC) data processing device, where the hashboard 12 can be provided with a plurality of hash chipsets, and each of the hash chipsets can include a plurality of hash chips. When the data processing device 10 receives a data processing task, the data processing task can be subdivided into a plurality of computing tasks, and the plurality of computing tasks are assigned to the hash chips for calculation. In other implementations, the data processing device 10 can also be other types such as a graphics card data processing device or a Field-Programmable Gate Array (FPGA) data processing device.

Further, the data processing device 10 can include a control board 13 in communicative connection to the hashboard 12 and a power supply module 14 in electrical connection to the hashboard 12, and the control board 13 and the power supply module 14 are both arranged in the accommodating cavity 111 and are in fixed connection to the housing 11. The control board 13 can be configured to receive a data processing task and assign the data processing task to a hashboard unit (such as a chip) on the hashboard 12 after receiving the data processing task. The control board 13 can be in fixed connection to the housing 11 in various ways. For example, the control board 13 can be in detachable connection to the housing 11 by using threaded fasteners, or can be in fixed connection to the housing 11 by bonding or welding. The power supply module 14 is configured for externally connecting to a power supply to supply power to the entire data processing device 10 through the connected external power supply, and the power supply module 14 has at least a function of stabilizing an output voltage or current so that the control board 13 and the hashboard 12 that are connected to the power supply module 14 can work reliably and stably. The power supply module 14 can be in fixed connection to the housing 11 in various ways. For example, the power supply module 14 can be in detachable connection to the housing 11 by using threaded fasteners, or can be in fixed connection to the housing 11 by bonding or welding. Further, when the power supply module 14 is connected to the external power supply, the control board 13 can be further configured to control the opening and closing of the power supply module 14. For example, the control board 13 can control on and off of a power supply circuit between the power supply module 14 and the control board 13 (or the hashboard 12). When the power supply module 14 is connected to the external power supply, the control board 13 can be further configured to adjust an output voltage of the power supply module 14 or read a working state of the power supply module 14. In the working process of the data processing device 10, heat generated by the power supply module 14 and the control board 13 can also be conducted to the housing 11 and dissipated to the external environment through the housing 11.

Figure 2:
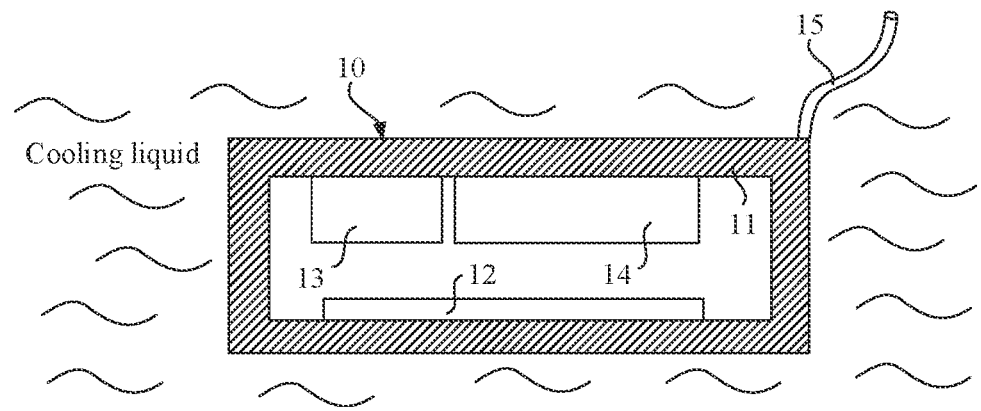
FIG. 2 is a schematic diagram of the data processing device shown in FIG. 1 in cooling liquid.

Still referring to FIG. 1, in some implementations, the data processing device 10 can further include a cable 15, and the housing 11 is provided with a through hole (not shown), the cable 15 is threaded through the through hole and in sealed connection to the housing 11. Further, the cable 15 is at least in electrical connection to the power supply module 14, and configured to supply power for the power supply module 14 when being connected to an external power supply. In some implementations, the cable 15 can further be in communicative connection to the control board 13 or the hashboard 12 to perform data transmission with external devices through the cable 15. Of course, this arrangement is not necessary, for example, the data processing device 10 can transmit data with the external devices by wireless communication or the like. The wireless communication may be Bluetooth communication, near field communication, cellular communication, or Wi-Fi communication. Further, referring to FIG. 2, in some implementations, the cable 15 and the housing 11 both have waterproof characteristics, so that the data processing device 10 can be partially or completely immersed in water to work normally in water and perform water cooling heat dissipation, to improve heat dissipation efficiency of the data processing device 10. Of course, in other implementations, the data processing device 10 can also be partially or completely immersed in other types of cooling liquid such as cooling oil to perform liquid cooling heat dissipation. In this implementation, the cable 15 can be well isolated from the cooling liquid to ensure reliable operation of the data processing device 10.

It can be understood that, the arrangement in which the cable 15 is threaded through the housing 11 is not necessary. For example, in some other implementations, an electrical connection interface can be arranged on a side where an outer surface of the housing 11 is located. The cable 15 configured to supply power to the data processing device can be docked to the electrical connection interface on the housing 11 to supply power to the data processing device 10 when the cable 15 is connected to an external power supply. This structure can improve the convenience of carrying the data processing device 10, and prevent accidental damage to the cable 15 caused because the cable 15 is cluttered or twined around the housing 11, and the user can select the cable 15 with an appropriate length to assemble with the housing 11 according to actual needs, so as to improve the convenience of assembly. The arrangement of the electrical connection interface can further ensure the sealing performance of the housing 11. For example, the electrical connection interface can be formed on the housing 11 by injection molding and the like to improve the sealing performance of the housing 11 at the electrical connection interface. Compared with the structure in which the cable 15 is threaded through the housing 11, this arrangement can avoid a case that relative displacement between the cable 15 and the housing 11 is generated at the through hole to reduce the sealing reliability.

For the above data processing device 10, since the housing 11 that is thermally conductive is provided with an accommodating cavity 111, and a hashboard 12 is arranged in the accommodating cavity 111 and is in fixed connection to the housing 11, the heat generated by the hashboard 12 in the working process can be conducted to the housing 11. The housing 11 can be partially or completely immersed in cooling liquid, such as water, for liquid cooling heat dissipation. Taking water cooling heat dissipation as an example, since the housing 11 isolates the hashboard 12 from the cooling water, compared with the heat dissipation solution with the water cooled board, this method can reduce the requirements for water quality, and it is unnecessary to use deionized water to avoid a case that water scale is generated to affect heat dissipation performance. Since the cooling water is located outside the housing 11 and does not flow in a closed pipeline or a water cooled board, the data processing device 10 of the present invention does not have high requirements for the water quality of the cooling water, and problems such as pipeline blockage can be avoided. The foregoing data processing device 10 can also avoid complex water circulation pipelines arranged at the periphery, thereby simplifying the arrangement of the heat dissipation system of the data processing device, and avoiding the waste of space by the heat dissipation system to improve the space utilization rate of the device. For example, the data processing device 10 can be partially or completely immersed in a cooling pool or a pooling tank. Of course, the cooling pool or the cooling tank can be connected to external pipelines to continuously inject the cooling liquid with relatively low temperature, and continuously discharge the heated cooling liquid to improve the heat dissipation efficiency of the whole heat dissipation system. In another example, the data processing device 10 can be partially or completely immersed in a river or lake, thereby simplifying the construction of the heat dissipation system and saving the cost of the heat dissipation system of the data processing device.

Figure 3:
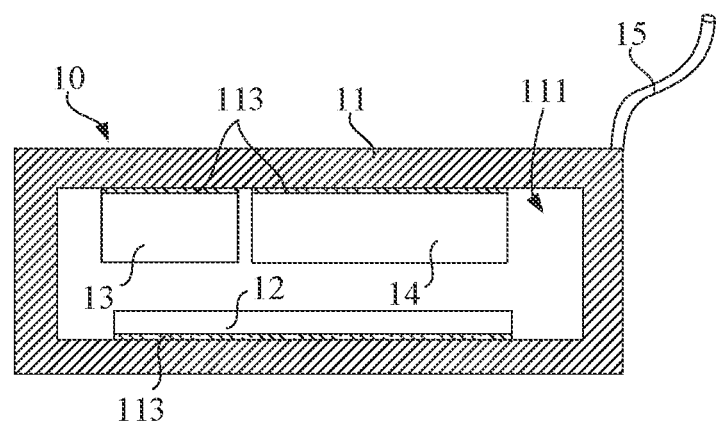
FIG. 3 is a cross-sectional view of a data processing device according to another embodiment.

Still referring to FIG. 1, in some implementations, the hashboard 12 attaches to an inner surface of the housing 11. This arrangement can increase the contact area between the hashboard 12 and the housing 11 to improve the heat exchange efficiency between the housing 11 and the hashboard 12, and further improve the heat dissipation performance of the data processing device 10. Further, referring to FIG. 3, in some implementations, a hashboard 12 attaches to an inner surface of a housing 11 through a heat dissipation layer 113, and the heat dissipation layer 113 can be seen as a part of the housing 11. The heat dissipation layer 113 can further improve the heat exchange efficiency between the hashboard 12 and the housing 11, further improving the heat dissipation performance of the data processing device 10. In some embodiments, the heat dissipation layer 113 is a thermally conductive silicone grease layer, and the thermally conductive silicone grease layer can improve the heat conduction speed between the hashboard 12 and the housing 11, to improve the heat exchange efficiency. In some other implementations, the heat dissipation layer 113 is a graphite layer, and the graphite layer can also improve the heat exchange efficiency between the hashboard 12 and the housing 11, to improve the heat dissipation performance of the data processing device 10. In other implementations, the heat dissipation layer 113 may alternatively be a thermally conductive silicone pad, and the thermally conductive silicone pad can also improve the heat dissipation performance of the data processing device 10.

Still referring to FIG. 1, in some implementations, the control board 13 attaches to the inner surface of the housing 11. This arrangement can increase the contact area between the control board 13 and the housing 11 to improve the heat exchange efficiency between the housing 11 and the control board 13, and further improve the heat dissipation performance of the data processing device 10. Further, referring to FIG. 3, in some implementations, the control board 13 attaches to the inner surface of the housing 11 through the heat dissipation layer 113, and the heat dissipation layer 113 can be seen as a part of the housing 11. The heat dissipation layer 113 can further improve the heat exchange efficiency between the control board 13 and the housing 11, further improving the heat dissipation performance of the data processing device 10. In some embodiments, the heat dissipation layer 113 may be at least one of the thermally conductive silicone grease layer, the graphite layer, or the thermally conductive silicone pad, and details are not described herein anymore.

Referring to FIG. 1, in some implementations, the power supply module 14 attaches to the inner surface of the housing 11. This arrangement can increase the contact area between the power supply module 14 and the housing 11 to improve the heat exchange efficiency between the housing 11 and the power supply module 14, and further improve the heat dissipation performance of the data processing device 10. Further, referring to FIG. 3, in some implementations, the power supply module 14 attaches to the inner surface of the housing 11 through the heat dissipation layer 113, and the heat dissipation layer 113 can be seen as a part of the housing 11. The heat dissipation layer 113 can further improve the heat exchange efficiency between the power supply module 14 and the housing 11, further improving the heat dissipation performance of the data processing device 10. In some embodiments, the heat dissipation layer 113 may be at least one of the thermally conductive silicone grease layer, the graphite layer, or the thermally conductive silicone pad, and details are not described herein anymore.

Of course, it can be understood that, it is not necessary to arrange the power supply module 14 in the housing 11. For example, the power supply module 14 can be arranged outside the data processing device 10, as long as it can supply power for the hashboard 12 and the control board 13 through a cable 15 when being connected to an external power supply. The data processing device 10 in this implementation can save the space occupied by the power supply module 14 in the housing 11, to improve the structural compactness of the data processing device 10. In an implementable manner, two or more data processing devices 10 without power supply modules 14 can be connected to an external unified power management platform through cables 15 respectively, and the power supply of the data processing devices 10 can be managed through the power management platform, so as to improve the structural compactness of the devices and the convenience of power management.

Similarly, it can be understood that the control board 13 does not have to be arranged in the housing 11. For example, the control board 13 may be arranged outside the data processing device 10, as long as it can be in communicative connection to the hashboard 12 through the cable 15. The data processing device 10 in this implementation can save the space occupied by the control board 13 in the housing 11, to improve the structural compactness of the data processing device 10. In an implementable manner, two or more data processing devices 10 without control boards 13 can be connected to an external unified control platform through cables 15 respectively, and the work of the data processing devices 10 can be controlled respectively through the control platform, so as to improve the structural compactness of the devices and the convenience of control.

In some implementations, the housing 11 is roughly in a shape of a rectangular box. Referring to FIG. 1, the housing 11 can include a first inner side wall 11a and a second inner side wall 11b arranged opposite to each other, and a circumferential inner side wall 11c connected between the first inner side wall 11a and the second inner side wall 11b, the first inner side wall 11a, the second inner side wall 11b, and the circumferential inner side wall 11c defining the accommodating cavity 111. The control board 13 and the power supply module 14 are both arranged on the first inner side wall 11a, and the hashboard 12 is arranged on the second inner side wall 11b. In this implementation, the length and width dimensions of the housing 11 can be equivalent to the length and width dimensions of the hashboard 12, and the control board 13 and the power supply module 14 can be both arranged opposite to the hashboard 12, so that the housing 11 has relatively small length and width dimensions and a relatively small height dimension, to improve the structural compactness of the data processing device 10. The foregoing implementation can further make the hashboard 12, the control board 13, and the power supply module 14 have a relatively large contact area with the inner surface of the housing 11, so as to improve the heat dissipation performance of the data processing device 10.

Figure 4:
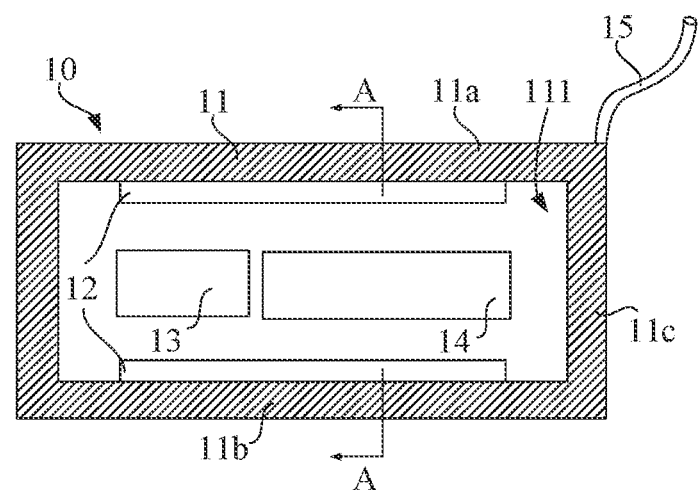
FIG. 4 is a cross-sectional view of a data processing device according to still another embodiment.
Figure 5:
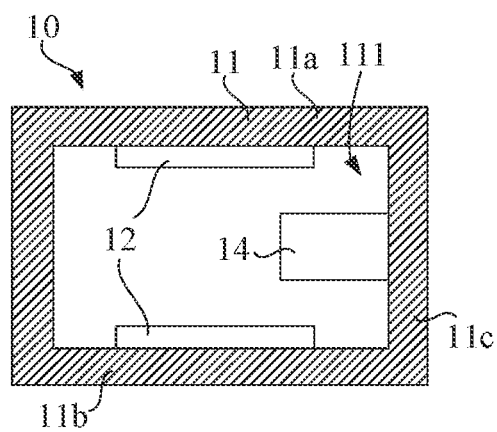
FIG. 5 is a cross-sectional view of the data processing device shown in FIG. 4 along A-A.

Referring to FIG. 4 and FIG. 5, in other implementations, two or more hashboards 12 can be arranged in an accommodating cavity 111. This implementation takes arrangement of two hashboards 12 as an example, where one hashboard 12 can be attached and fixed to a first inner side wall 11a, and the other hashboard 12 can be attached and fixed to a second inner side wall 11b. The two hashboards 12 are arranged opposite to each other, and a control board 13 and a power supply module 14 are arranged on a circumferential inner side wall 11c. Further, taking a housing 11 in a shape of a rectangular box as an example, the control board 13 and the power supply module 14 can be arranged on different circumferential inner side walls 11c respectively. For example, the control board 13 and the power supply module 14 can be respectively arranged on two opposite circumferential inner side walls 11c, or the control board 13 and the power supply module 14 can be respectively arranged on two adjacent circumferential inner side walls 11c. In other implementations, another hashboard 12 can also be arranged on an inner surface of the circumferential inner side wall 11c of the housing 11, to arrange a plurality of hashboards 12 in a single data processing device 10, so as to improve a total computing power of the single data processing device 10, namely, to achieve stronger performance of the single data processing device 10.

Of course, in other implementations, the housing 11 may in other shapes. For example, the housing 11 may be cylindrical, that is, a cross section of the housing 11 is circular. In another example, the cross section of the housing 11 may be polygonal, such as pentagonal, hexagonal, or specially-shaped. In still another example, the shape of the housing 11 may be a shape of frustum of a cone or a shape of frustum of a pyramid, and details are not described herein anymore.

Figure 6:
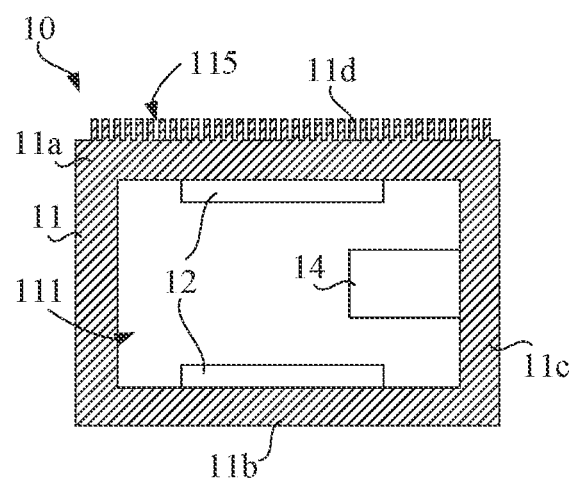
FIG. 6 is a cross-sectional view of a data processing device according to still another embodiment.

Referring to FIG. 6, in some implementations, a side of a housing 11 facing away from an accommodating cavity 111 is provided with a plurality of heat dissipation fins 11d arranged at intervals, and the heat dissipation fins 11d may be made of the same material as that of the housing 11 and may be integrally shaped with the housing 11. There are a plurality of heat dissipation grooves 115 arranged at intervals between the heat dissipation fins 11d. The heat dissipation fins 11d can provide a relatively large heat dissipation area, and the heat of the housing 11 can be dissipated to the external environment through the heat dissipation fins 11d, thereby improving the heat dissipation performance of the data processing device 10. In the implementation in which the housing 11 is in the shape of a rectangular box, a first inner side wall 11a, a second inner side wall 11b, and a circumferential inner side wall 11c of the housing 11 may be each provided with heat dissipation fins 11d, and the heat dissipation fins 11d may be distributed on an entire outer surface of the housing 11 to further improve the heat dissipation performance of the data processing device 10. Of course, in some other implementations, the heat dissipation fins 11d may only be arranged at some positions of the first inner side wall 11a, the second inner side wall 11b, and the circumferential inner side wall 11c. It can be understood that in other implementations, the heat dissipation fins 11d may be made of a material different from that of the housing 11, and the heat dissipation fins 11d may be independently shaped and assembled to the housing 11. For example, the material of the housing 11 may be aluminum alloy, and the material of the heat dissipation fin 11d may be copper alloy. After being integrally shaped, the plurality of heat dissipation fins 11d may be fixedly connected to the outer surface of the housing 11 by welding, bonding or screwing. This structure can also improve the heat dissipation performance of the data processing device 10.

Figure 7:
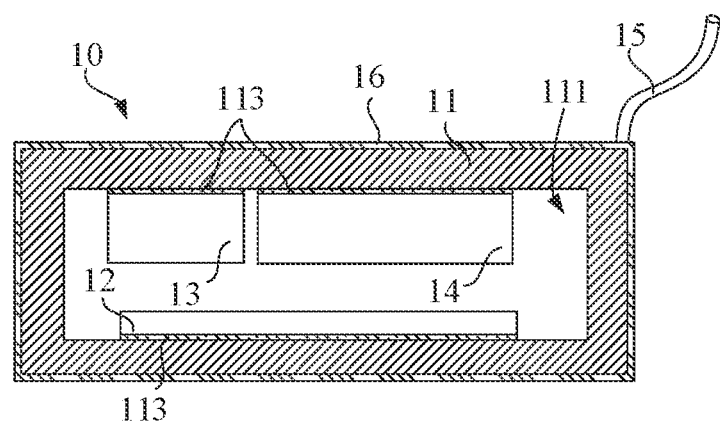
FIG. 7 is a cross-sectional view of a data processing device according to still another embodiment.

Referring to FIG. 7, in some other implementations, a side of the housing 11 facing away from an accommodating cavity 111 may be covered with a heat dissipation ceramic coating 16. The heat dissipation ceramic coating 16 can improve the efficiency of radiation heat dissipation. For example, the heat dissipation ceramic coating 16 can radiate heat to the outside at an infrared wavelength of 8 microns to 13.5 microns to reduce the temperature of the surface and the interior of the housing 11. Therefore, the heat dissipation efficiency of the housing 11 can be significantly improved and the temperature rise of the housing 11 can be reduced. The heat dissipation ceramic coating 16 further has the advantages of not affected by the surrounding medium and the like, so that the data processing device 10 can be adapted to more liquid cooling heat dissipation environments. Further, the arrangement of the heat dissipation ceramic coating 16 can further improve the surface performance of the data processing device 10, for example, it can improve the surface structure strength of the data processing device 10, and improve the corrosion resistance and wear resistance of its surface.

Figure 8:
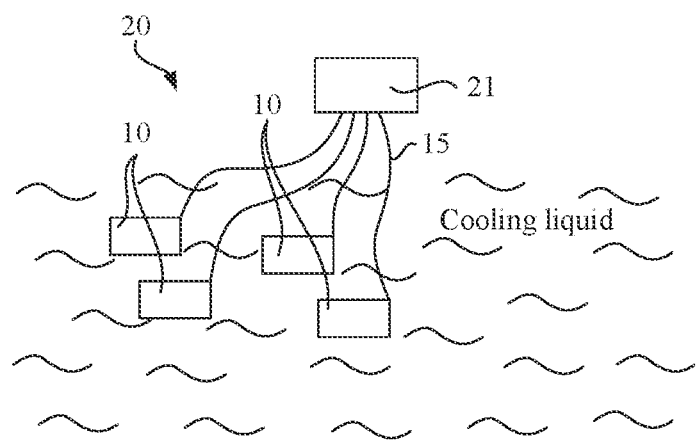
FIG. 8 is a schematic diagram of a data processing system in cooling liquid according to an embodiment.

Referring to FIG. 8, the present invention further provides a data processing system 20. The data processing system 20 includes a console 21 and the data processing devices 10 in the above embodiments. A plurality of data processing devices 10 may be configured. For example, each data processing system 20 may be configured with two or more data processing devices 10, and the plurality of data processing devices 10 are in electrical connection to the console 21 respectively. Each data processing device 10 may be in electrical connection to the console 21 through a cable 15, and the console 21 may supply power to each data processing device 10. The console 21 may also communicate with the data processing devices 10 through a cable 15 to uniformly or respectively and independently control the working states of the data processing devices 10. Further, all the data processing devices 10 can be immersed in a cooling pool, a cooling tank, or a river or lake to simultaneously perform liquid cooling heat dissipation for the plurality of data processing devices 10, thereby improving the heat dissipation performance of the data processing system 20. The data processing device of this application may be, for example, a virtual currency mining machine.

The technical features in the foregoing embodiments may be randomly combined. For concise description, not all possible combinations of the technical features in the embodiments are described. However, provided that combinations of the technical features do not conflict with each other, the combinations of the technical features are considered as falling within the scope described in this specification.

The foregoing embodiments only describe several implementations of the present invention specifically and in detail, but they are not to be construed as a limitation to the patent scope of the present invention. It should be pointed that a person of ordinary skill in the art may make various changes and improvements without departing from the ideas of the present invention, which shall all fall within the protection scope of the present invention. Therefore, the protection scope of the present invention is subject to the protection scope of the appended claims.

What is claimed is:

1. A data processing device, comprising:
 a housing, which is thermally conductive and defines a sealed accommodating cavity;
 a hashboard, which is arranged in the accommodating cavity and is in fixed connection to the housing;
 a control board, which is in communicative connection to the hashboard; and
 a power supply module, which is in electrical connection to the hashboard.

2. The data processing device according to claim 1, wherein at least one of the hashboard, the control board, and the power supply module attaches to an inner surface of the housing.

3. The data processing device according to claim 1, wherein the housing comprises a first inner side wall and a second inner side wall arranged opposite to each other, and a circumferential inner side wall connected between the first inner side wall and the second inner side wall, the first inner side wall, the second inner side wall, and the circumferential inner side wall defining the accommodating cavity; and the control board and the power supply module are both arranged on the first inner side wall and the hashboard is arranged on the second inner side wall.

4. The data processing device according to claim 1, wherein the housing comprises a first inner side wall and a second inner side wall arranged opposite to each other, and a circumferential inner side wall connected between the first inner side wall and the second inner side wall, the first inner side wall, the second inner side wall, and the circumferential inner side wall defining the accommodating cavity; and the first inner side wall and the second inner side wall are each provided with the hashboard, and the control board and the power supply module are arranged on the circumferential inner side wall.

5. The data processing device according to claim 1, wherein the housing is provided with a through hole used for threading a cable, wherein the cable is in electrical connection to the power supply module, and the cable is in sealed connection to the housing.

6. The data processing device according to claim 1, wherein a side of the housing facing away from the accommodating cavity is provided with a plurality of heat dissipation fins arranged at intervals; or, a side of the housing facing away from the accommodating cavity is covered with a heat dissipation ceramic coating.

7. The data processing device according to claim 1, wherein at least one of the hashboard, the control board, and the power supply module attaches to an inner surface of the housing through a heat dissipation layer, wherein the heat dissipation layer comprises at least one of a graphite layer, a thermally conductive silicone grease layer, and a thermally conductive silicone pad.

8. The data processing device according to claim 1, wherein the hashboard is provided with a plurality of hash chipsets, and each of the hash chipsets comprises a plurality of hash chips.

9. A data processing system, comprising a console and the data processing device according to claim 1, wherein there are a plurality of data processing devices configured, the plurality of data processing devices are in electrical connection to the console respectively, and the console is configured to control working states of the data processing devices.

* * * * *